(12) United States Patent
Garcia et al.

(10) Patent No.: US 11,978,607 B2
(45) Date of Patent: May 7, 2024

(54) SMART CIRCUIT INTERRUPTER ACCESSORIES INTERNAL COMPONENT DIAGNOSTICS

(71) Applicant: Eaton Intelligent Power Limited, Dublin (IE)

(72) Inventors: Patrick Martinez Garcia, Santo Domingo (DO); Paul R. Rakus, Coraopolis, PA (US); James L. Lagree, Robinson Township, PA (US); David R. Rohn, Venetia, PA (US); Kevin Sippel, Burlington, KY (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 262 days.

(21) Appl. No.: 17/204,300

(22) Filed: Mar. 17, 2021

(65) Prior Publication Data
US 2022/0301801 A1 Sep. 22, 2022

(51) Int. Cl.
*H01H 71/32* (2006.01)
*G01R 31/327* (2006.01)
(Continued)

(52) U.S. Cl.
CPC ......... *H01H 71/322* (2013.01); *H01F 7/1844* (2013.01); *H01H 83/20* (2013.01); *G01R 31/3278* (2013.01); *H01H 2083/203* (2013.01)

(58) Field of Classification Search
CPC ............ G01R 31/3275; G01R 31/3278; H01F 7/1844; H01H 2071/044; H01H 2083/203;
(Continued)

(56) References Cited

U.S. PATENT DOCUMENTS

| | | | |
|---|---|---|---|
| 4,412,284 A | 10/1983 | Kerforne et al. | |
| 5,729,119 A | 3/1998 | Barbour | |

(Continued)

FOREIGN PATENT DOCUMENTS

| | | | | |
|---|---|---|---|---|
| EP | 1 939 915 A2 | 7/2008 | | |
| EP | 2458611 A1 * | 5/2012 | ............. | H01H 71/04 |

(Continued)

OTHER PUBLICATIONS

European Patent Office, "extended European search report" for corresponding European Application No. 22162601.3, dated Aug. 22, 2022, 9 pp.

(Continued)

*Primary Examiner* — Jared Fureman
*Assistant Examiner* — Nicolas Bellido
(74) *Attorney, Agent, or Firm* — Eckert Seamans Cherin & Mellott, LLC (57) ABSTRACT

A smart accessory device includes an actuator and is designed to be used to actuate an operating mechanism of a circuit breaker in order to either open or close the separable contacts of the circuit breaker. The accessory can be one of a shunt trip, spring release, or under voltage release device. The actuator includes a solenoid and plunger. The accessory determines the operating condition of the actuator based on how much current flows through the coil when the power source provides power to the accessory device, and continually executes a coil diagnostic to determine the operating condition of the coil while power is being provided to the accessory device. If the accessory fails to trip the circuit breaker when required, the accessory can determine whether the failure was due to either of the solenoid or the plunger.

20 Claims, 5 Drawing Sheets

(51) Int. Cl.
*H01F 7/18* (2006.01)
*H01H 83/20* (2006.01)

(58) Field of Classification Search
CPC ........... H01H 2300/052; H01H 47/002; H01H 71/04; H01H 71/2463; H01H 71/322; H01H 83/20; H01H 9/168
See application file for complete search history.

(56) References Cited

U.S. PATENT DOCUMENTS

| | | | | |
|---|---|---|---|---|
| 8,907,751 | B2* | 12/2014 | Borgwardt | H01H 83/04 |
| | | | | 361/93.6 |
| 8,934,208 | B2* | 1/2015 | De Natale | H01H 47/002 |
| | | | | 361/93.1 |
| 2008/0156791 | A1 | 7/2008 | Finney et al. | |
| 2008/0157776 | A1* | 7/2008 | Jaffer | H01H 71/123 |
| | | | | 324/424 |
| 2012/0014032 | A1* | 1/2012 | De Natale | H01H 47/002 |
| | | | | 361/160 |
| 2015/0276877 | A1 | 10/2015 | Biswas et al. | |
| 2016/0103180 | A1 | 4/2016 | Ricciuti | |
| 2020/0363474 | A1 | 11/2020 | Zhang et al. | |
| 2022/0299971 | A1* | 9/2022 | Garcia | H02H 1/0007 |

FOREIGN PATENT DOCUMENTS

| | | | | |
|---|---|---|---|---|
| WO | 2017/178325 | A1 | 10/2017 | |
| WO | WO-2017178325 | A1 * | 10/2017 | ......... G01R 31/3272 |
| WO | WO-2022060902 | A1 * | 3/2022 | |

OTHER PUBLICATIONS

USPTO "First Office Action" for corresponding U.S. Appl. No. 17/204,297, dated Jan. 9, 2023, 35 pp.

* cited by examiner

SMART CIRCUIT INTERRUPTER ACCESSORIES INTERNAL COMPONENT DIAGNOSTICS

BACKGROUND

Field

The disclosed concept relates generally to diagnostics systems for circuit breaker accessories and in particular, to systems for monitoring the state of the internal components of shunt trip, spring release, and under voltage release devices.

Background Information

Circuit interrupters, such as for example and without limitation, circuit breakers, are typically used to protect electrical circuitry from damage due to an overcurrent condition, such as an overload condition, a short circuit, or another fault condition, such as an arc fault or a ground fault. Circuit breakers typically include separable contacts. The separable contacts may be operated either manually by way of an operator handle or automatically in response to a detected fault condition. Typically, such circuit breakers include an operating mechanism, which is designed to rapidly open and close the separable contacts, and a trip mechanism, such as a trip unit, which senses a number of fault conditions to trip the breaker automatically. Upon sensing a fault condition, the trip unit causes the operating mechanism to trip open the separable contacts.

Circuit breaker accessories such as shunt trip, spring release, and under voltage release devices can be operatively connected to a circuit breaker and used to open and close the separable contacts. A shunt trip assembly typically includes a conductive coil and armature operating mechanism that is coupled to the circuit breaker operating mechanism by a mechanical linkage such that movement in the shunt trip operating mechanism causes corresponding movement in the circuit breaker operating mechanism. The shunt trip assembly is additionally operatively coupled to a remote power source that is structured to energize the coil and actuate the shunt trip operating mechanism such that an operator at a remote location can open the circuit breaker separable contacts. An under voltage release device includes a conductive coil connected to a spring, wherein the coil requires a continuous power supply to maintain the spring in a position that keeps the separable contacts of circuit breaker closed and consequently trips the circuit breaker open when supply voltage to the under voltage release device drops below a threshold voltage. A spring release device comprises a coil and armature operating mechanism that causes a compressed spring to expand when the coil is energized by a voltage input and can remotely cause the operating mechanism of a circuit breaker to close the separable contacts by expanding the compressed spring.

As with any electrical or mechanical components, the components of circuit breaker accessory devices such as shunt trip, spring release, and under voltage release devices can malfunction and/or wear down. Malfunctioning and wearing down of the accessory devices can in turn prevent the circuit breaker from operating properly. When a circuit breaker fails to operate properly, determining whether the issue lies within the components of the circuit breaker or the components of a connected accessory device can be time-consuming and inefficient.

There is thus room for improvement in diagnostics systems for circuit breaker accessory devices.

SUMMARY

Accordingly, it is an object of the present invention to provide, in an exemplary embodiment, a smart accessory device structured to be operatively connected to a circuit breaker so as to actuate an operating mechanism of the circuit breaker, the accessory device including: a power section structured to be electrically connected to a power source and including an actuator, a current sensor, and a voltage sensor; and a control section electrically and operatively connected to the power section, the control section including a processor. The actuator is structured to actuate the operating mechanism of the circuit breaker and includes a solenoid comprising a coil of conductive wire and a ferromagnetic plunger coupled to the solenoid, with the plunger being structured to move relative to the solenoid in response to current flowing through the solenoid. The current sensor is structured to sense a current flowing through the power section and the voltage sensor is structured to sense a voltage across the power section. The processor is configured to determine an operating condition of the actuator based on how much current flows through the coil when the power source provides power to the accessory device.

In another exemplary embodiment, a smart accessory device structured to be operatively connected to a circuit breaker so as to actuate an operating mechanism of the circuit breaker, the accessory device including: a power section structured to be electrically connected to a power source and including an actuator, a current sensor, and a voltage sensor; and a control section electrically and operatively connected to the power section, the control section including a processor. The actuator is structured to actuate the operating mechanism of the circuit breaker and includes a solenoid comprising a coil of conductive wire and a ferromagnetic plunger coupled to the solenoid, with the plunger being structured to move relative to the solenoid in response to current flowing through the solenoid. The current sensor is structured to sense a current flowing through the power section and the voltage sensor is structured to sense a voltage across the power section. The processor is configured to determine an operating condition of the actuator based on how much current flows through the coil when the power source provides power to the accessory device. The processor is also configured to continually execute a coil diagnostic to determine the operating condition of the coil as long as power is being provided to the accessory device.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Directional phrases used herein, such as, for example, left, right, front, back, top, bottom and derivatives thereof, relate to the orientation of the elements shown in the drawings and are not limiting upon the claims unless expressly recited therein.

As used herein, the singular form of "a", "an", and "the" include plural references unless the context clearly dictates otherwise.

As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other. As used herein, "movably coupled" means that two components are coupled so as to allow at least one of the components to move in a manner such that the orientation of the at least one component relative to the other component changes.

As employed herein, the term "number" shall mean one or an integer greater than one (i.e., a plurality).

As employed herein, the term "processor" shall mean a programmable analog and/or digital device that can store, retrieve and process data; a controller; a control circuit; a computer; a workstation; a personal computer; a microprocessor; a microcontroller; a microcomputer; a central processing unit; a mainframe computer; a mini-computer; a server; a networked processor; or any suitable processing device or apparatus.

Figure 1:
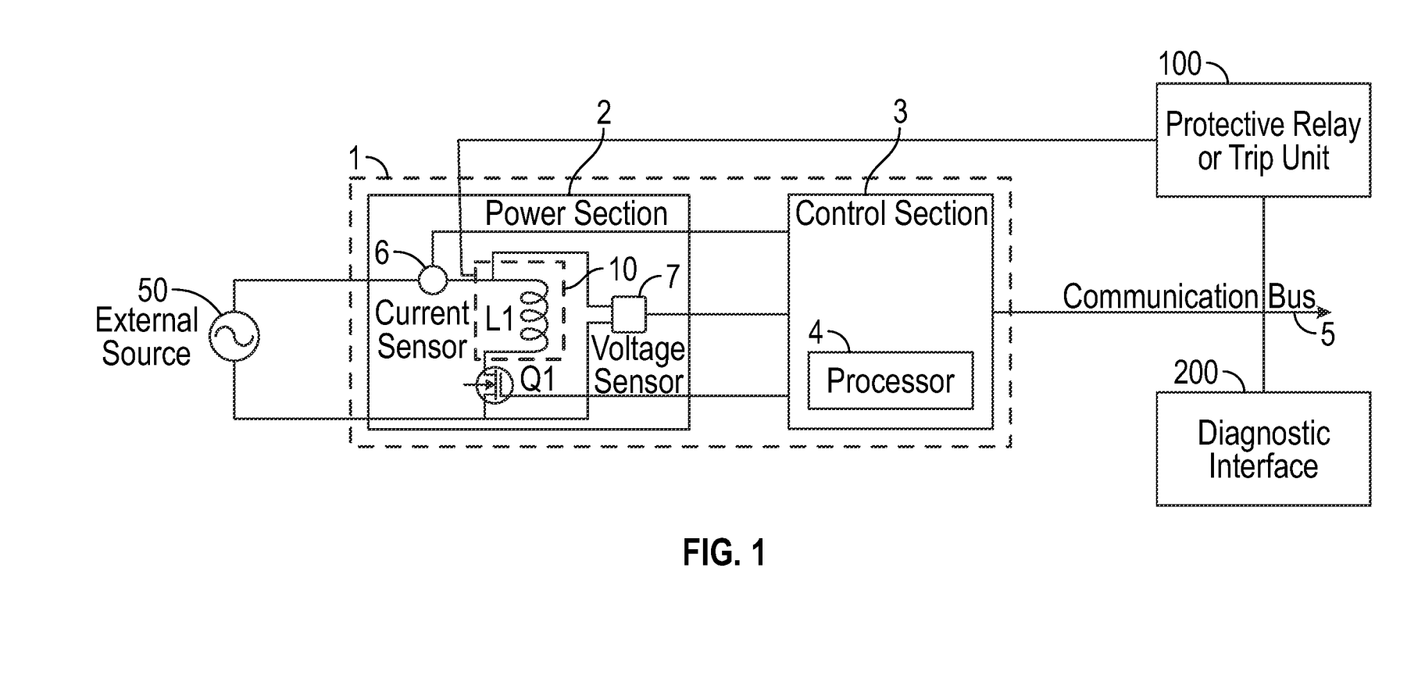
FIG. 1 is a schematic diagram of a smart circuit breaker accessory device in accordance with an example embodiment of the disclosed concept.

FIG. 1 shows a schematic depiction of a smart accessory 1 structured to be operatively coupled to a protective relay or trip unit 100 of a circuit breaker according to an exemplary embodiment of the disclosed concept. For economy of disclosure, the protective relay or trip unit 100 will be referred to hereinafter as the trip unit 100, but it will be appreciated that the trip unit 100 can instead or additionally comprise a protective relay without departing from the scope of the disclosed concept. The trip unit 100 trips open the separable contacts of the associated circuit breaker (not pictured) upon detection of a fault condition. Accessory 1 can be, for example and without limitation, a shunt trip, spring release, or under voltage release device structured to be used with the circuit breaker associated with the trip unit 100.

Accessory 1 comprises a power section 2 and a control section 3, the power section 2 and the control section 3 each containing electrical circuitry and being in electrical communication with and operatively coupled to one another. The control section 3 further comprises a processor 4, which performs diagnostic functions for the accessory 1 as described in more detail herein with respect to FIG. 3 and FIG. 5. In addition, circuit breaker accessory devices such as accessory 1 are often powered by external power sources, and the power section 2 is in direct electrical communication with an external power source 50, while the control section 3 is in direct electrical communication with a communication bus 5 that enables communication between the accessory 1 and any other entity connected to the bus 5.

Non-limiting examples of entities that can be connected to the bus 5 include the trip unit 100 (including the supervisory intelligence of the trip unit or protective relay) and a diagnostic interface 200 through which a user can receive information provided by the accessory 1 about the state of the accessory 1. It will be appreciated that the schematic depiction of the accessory 1, the trip unit 100, and the diagnostic interface 200 in FIG. 1 is meant to be illustrative and is not intended to be limiting on the scope of the disclosed concept. For example, the diagnostic interface 200 is depicted as being a separate component from the trip unit 100, but both the diagnostic interface 200 and the trip unit 100 can be included in the same physical structure housing the associated circuit breaker without departing from the scope of the disclosed concept.

For economy of disclosure, the power section 2 and the control section 3 are depicted in a simplified manner in FIG. 1, as are the elements of the power section 2 schematically shown in FIG. 1, and it will be appreciated that the elements of the power section 2 shown in FIG. 1 are illustrative and not intended to limit the scope of the disclosed concept. In particular, a current sensor 6 and a voltage sensor 7 are included in the power section 2 so that the control section 3 can monitor the current through and the voltage across the internal components of the power section 2, but the specific implementations of the current sensor 6 and voltage sensor 7 shown in FIG. 1 are illustrative in nature and intended to be non-limiting. For example, the current sensor 6 is depicted as being in series between the power source 50 and an input terminal of an inductor L1 (which also represents an actuator 10 of the accessory 1 as described with respect to FIG. 2 herein), but the current sensor 6 can be placed elsewhere in the power section 2 and more than one current sensor can be included in the power section 2 without departing from the scope of the disclosed concept. In another example, the voltage sensor 7 is depicted as being in parallel with the series-connected actuator 10 (inductor L1) and MOSFET Q1, but the voltage across the actuator 10 can be measured using elements other a MOSFET in series with the actuator 10 without departing from the scope of the disclosed concept.

Figure 2A:
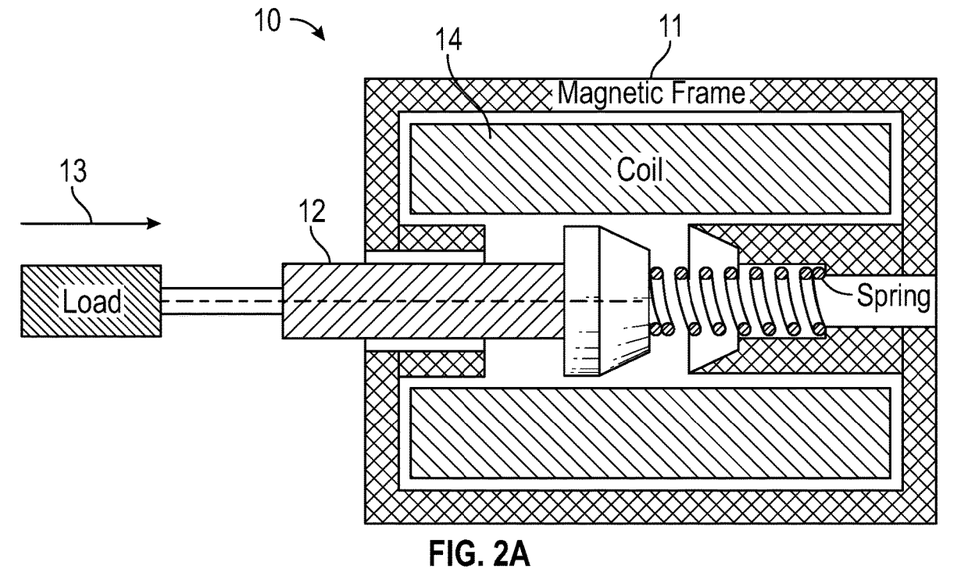
FIG. 2A shows a cross-sectional view of a pull-type solenoid and plunger arrangement used as an actuator in the accessory device shown in FIG. 1 in accordance with an example embodiment of the disclosed concept.
Figure 2B:
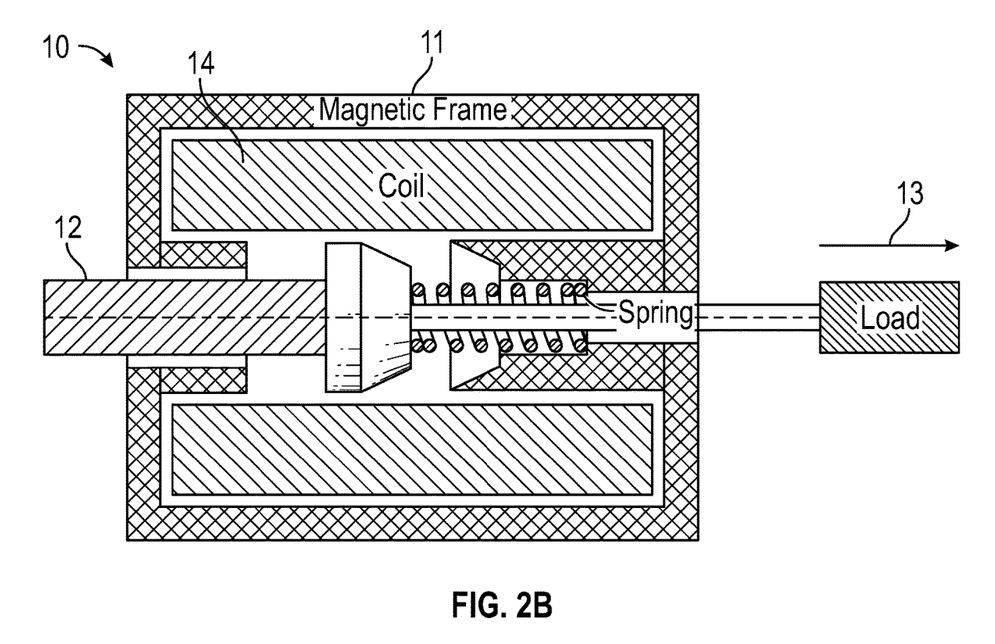
FIG. 2B shows a cross-sectional view of a push-type solenoid and plunger arrangement used as an actuator in the accessory device shown in FIG. 1 in accordance with an example embodiment of the disclosed concept.

Still referring to FIG. 1, the actuating mechanism of the shunt trip, spring release, and under voltage release devices that an accessory 1 can comprise often includes a solenoid and plunger arrangement, such as the actuator 10 shown in FIGS. 2A and 2B. Referring now to FIGS. 2A and 2B, which show a cross-sectional view of a solenoid 11 and a plunger 12, the solenoid 11 comprises a coil 14 of conductive wire wound around a bobbin and enclosed by a magnetic frame (the bobbin and frame not being numbered), with the ends of the coil structured to be electrically connected to a power source, such as the external power source 50. The plunger 12 is produced from ferromagnetic material and is mechanically coupled to the solenoid 11. When power is provided to the solenoid 11 and current flows through the coil 14, a magnetic field is generated and actuates the plunger 12 to move in the direction indicated by the arrow 13.

A load 20 can be coupled to the plunger 12, such that the plunger 12 either acts as a pull-type plunger (shown in FIG. 2A) or a push-type plunger (shown in FIG. 2B) when actuated. For example, a solenoid 11 used in an under voltage release device is generally coupled to a pull-type plunger 12 as shown in FIG. 2A, while a solenoid 11 used in a shunt trip or spring release device is generally coupled to a push-type plunger 12 as shown in FIG. 2B. However, whether the type of plunger 12 coupled to a solenoid 11 included in an accessory 1 is a pull-type or push-type is not intended to limit the scope of the disclosed concept. In addition, an optional spring is sometimes coupled to the solenoid frame as well (as shown in FIG. 2A and FIG. 2B), particularly in under voltage release devices. In the context of circuit breaker accessory devices, if the accessory 1 is a shunt trip or under voltage release device, the load 20 coupled to the plunger 12 is generally a component that actuates the circuit breaker operating mechanism to open the separable contacts, and if the accessory 1 is a spring release device, the load 20 coupled to the plunger 12 is generally a component that actuates the circuit breaker operating mechanism to close the separable contacts.

The accessory 1 can only actuate the circuit breaker operating mechanism if the actuator 10 is operating properly, and a solenoid-based actuator such as actuator 10 can only operate properly if current is able to properly flow through the solenoid coil 14 and the plunger 12 is able to move in response to the magnetic field generated when current flows through the coil 14. However, various conditions can cause a solenoid coil 14 to create a short circuit or conversely, to burn out and open such that current cannot flow through the coil 14. In addition, in a solenoid-based actuator, a plunger 12 can become stuck and unable to move even when current is able to properly flow through the solenoid coil 14. For example, solenoid bobbins can be produced from plastic, and if a high current flows through the solenoid coil 14 for too long, the heat of the current can melt the plastic of the bobbin and cause the plunger 12 to become stuck. In another example, if the shunt trip device is installed within the parent circuit breaker, the mechanical shock and/or vibration to which the parent breaker is subjected can cause the plunger to become stuck.

It is therefore an object of the present disclosure to provide diagnostic mechanisms (described in more detail with respect to FIGS. 3-5 herein) that can alert a user in real time if any component of an actuator 10 is non-operational or failing (i.e. approaching a non-operational condition). The actuator 10 of the accessory 1 is depicted in FIGS. 2A and 2B as comprising a solenoid 11 and a plunger 12 for economy of disclosure, as a solenoid 11 and plunger 12 are often used as actuators in circuit breaker accessory devices, however, it will be appreciated that the diagnostics described hereinafter can be applied to other types of actuators without departing from the scope of the disclosed concept.

Figure 3:
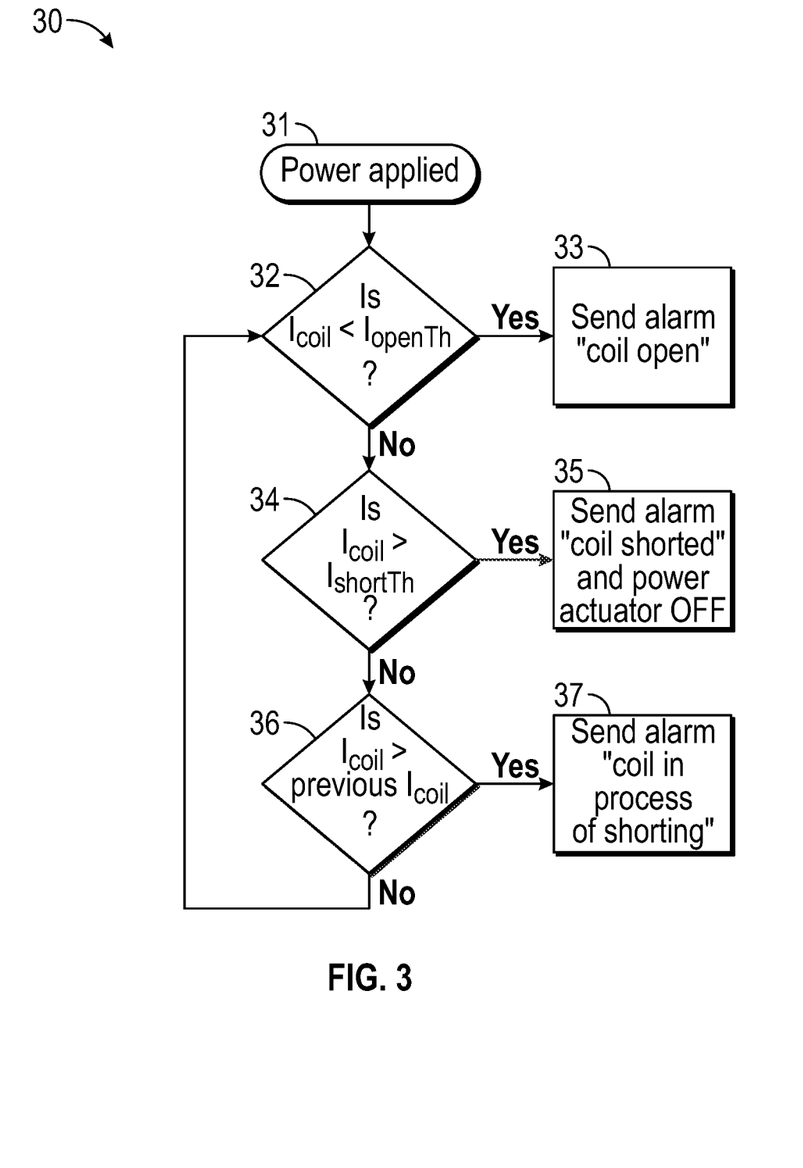
FIG. 3 is a flow chart containing the steps of a coil diagnostic executed by a control section of the accessory device shown in FIG. 1 in accordance with an exemplary embodiment of the disclosed concept.
Figure 4A:
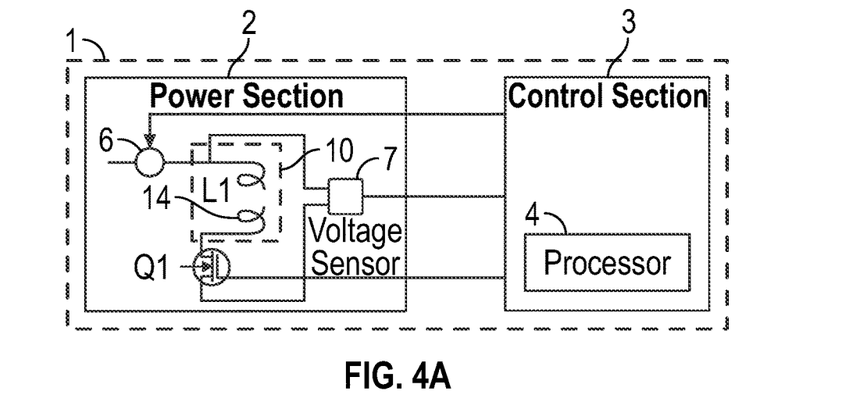
FIG. 4A is a schematic diagram of the circuit breaker accessory device shown in FIG. 1, shown with an open actuator coil.

Referring to FIGS. 3, 4A, 4B, and 4C, and in accordance with an exemplary embodiment of the disclosed concept, the processor 4 shown in FIG. 1 continually monitors the current flow through the actuator 10 while power is being supplied to the accessory 1 by executing a coil diagnostic 30, represented by the flow chart shown in FIG. 3, to determine the operating condition of the solenoid coil 14 at any given time and whether the coil 14 is failing or non-operational. At step 31 of diagnostic 30, the external power source 50 applies power to the accessory 1. At step 32, the processor 4 checks whether the solenoid coil 14 has become open. FIG. 4A shows the accessory 1 shown in FIG. 1 with a coil 14 that has opened, and the processor 4 can detect an open circuit condition such as that shown in FIG. 4A when a current $I_{coil}$ through the solenoid coil 14 (detected by the current sensor 6) is less than a certain predetermined threshold current $I_{openTh}$ deemed to be indicative of an open coil. When the coil 14 is open, the actuator 10 will never trip the circuit breaker since current is unable to flow through the coil 14 to actuate the plunger 12, so if the processor 4 detects an open coil condition at step 32 of diagnostic 30, the processor 4 reports the open coil condition by triggering an alarm at step 33. The alarm can comprise, for example and without limitation, a sound notification such as a beep, a visual notification such as a toggled sticker display or an illuminated LED, or a notification sent to a remote device via wireless communication. It will be appreciated that the trip unit 100 can be programmed with software to have wireless communication (or other communication) capability, and that a trip unit 100 so programmed transmits a notification to the remote device after receiving a message from the processor 4 on the bus 5 indicating that an alarm condition exists.

Figure 4B:
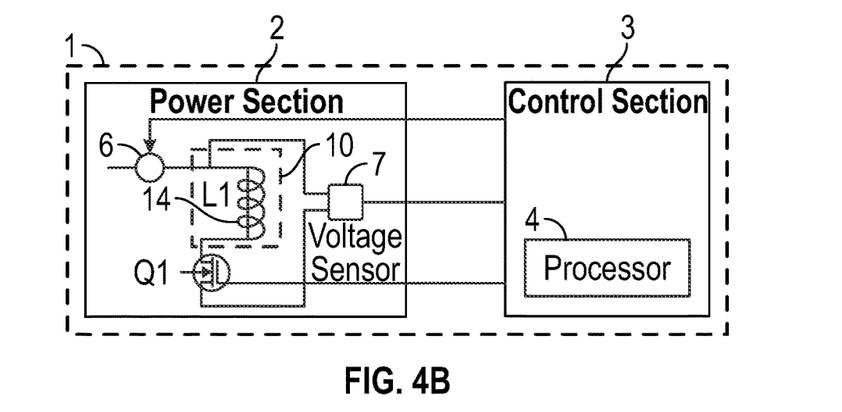
FIG. 4B is a schematic diagram of the circuit breaker accessory device shown in FIG. 1, shown with a shorted actuator coil.

Referring again to FIG. 3, if an open coil condition was not detected at step 32, then diagnostic 30 proceeds to step 34 and the processor 4 checks whether the solenoid coil 14 has shorted. FIG. 4B shows the accessory 1 shown in FIG. 1 with a coil 14 that has shorted, and the processor 4 can detect a short circuit condition such as that shown in FIG. 4B when the current $I_{coil}$ through the solenoid coil 14 exceeds a certain predetermined threshold current $I_{shortTh}$ deemed to be indicative of a shorted coil. When the coil 14 is shorted, current flow through the coil 14 can reach levels damaging to the actuator 10, so if the processor 4 detects a shorted coil condition at step 34 of diagnostic 30, the processor 4 cuts off power to the actuator 10 and reports the shorted coil condition by triggering an alarm at step 35.

Figure 4C:
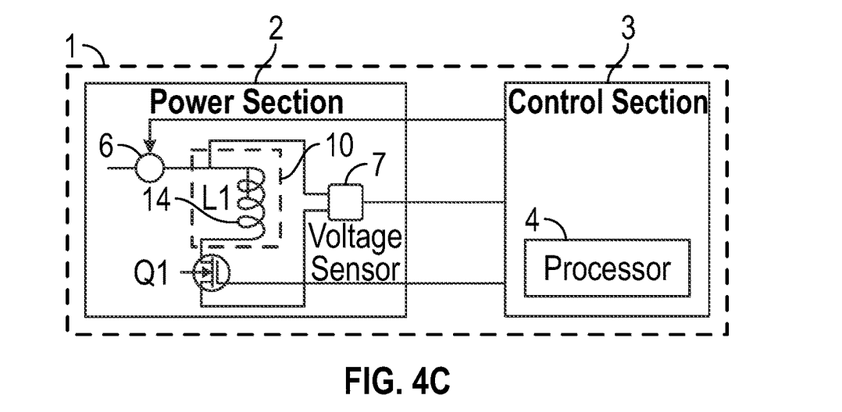
FIG. 4C is a schematic diagram of the circuit breaker accessory device shown in FIG. 1, shown with partially shorted actuator coil.

Referring again to FIG. 3, if a shorted coil condition was not detected at step 34, then diagnostic 30 proceeds to step 36 and the processor 4 checks whether any individual turns of the solenoid coil 14 have shorted such that the coil 14 is partially shorted (as opposed to checking at step 34 whether the entire coil 14 has shorted). FIG. 4C shows the accessory 1 shown in FIG. 1, with a coil 14 that has partially shorted. A partial short circuit condition occurs when only some of the turns of the coil 14 have shorted, rather than the entire coil 14. In operation, sometimes only a few turns of a coil 14 fail at a time with successively more turns of the coil 14 failing over time, rather than all of the turns of the entire coil 14 shorting all at once. The current draw of the coil 14 increases as more turns short. The processor 4 can detect a partial short circuit condition such as that shown in FIG. 4C when the current $I_{coil}$ through the solenoid coil 14 has increased relative to a previously executed cycle of diagnostic 30. If the processor 4 detects a partially shorted coil condition at step 36 of diagnostic 30, the processor 4 reports the shorted coil condition by triggering an alarm at step 37 so that a user can replace the coil 14 before enough turns become shorted to draw a damaging amount of current. If the processor 4 does not detect an open coil, shorted coil, or partially shorted coil after iterating through steps 32, 34, and 36 of diagnostic 30, that cycle of diagnostic 30 is complete.

The diagnostic 30 then returns to step 32 to execute another cycle until power to the accessory 1 is cut off.

Figure 5:
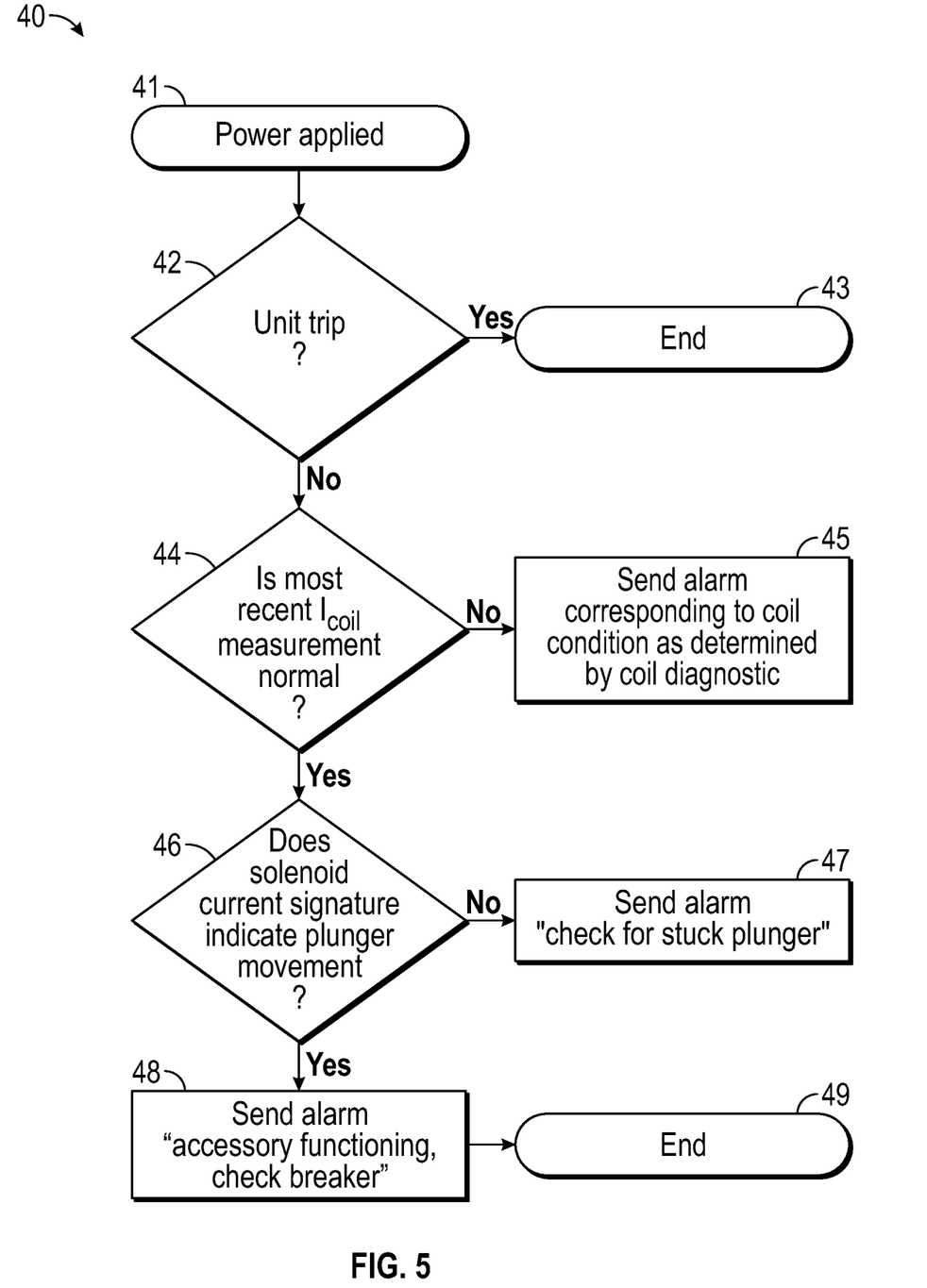
FIG. 5 is a flow chart containing the steps of a plunger diagnostic executed by a control section of the accessory device shown in FIG. 1 in accordance with an exemplary embodiment of the disclosed concept.

Even if the coil 14 is in good operating condition as determined by running the coil diagnostic 30, the accessory actuator 10 can still fail to trip the circuit breaker if the plunger 12 becomes stuck and cannot move when the coil 14 is energized. Referring to FIG. 5, the processor 4 is configured to execute a plunger diagnostic 40 in the event that the accessory 1 fails to trip the circuit breaker when it should. For example and without limitation, the processor 4 can determine that the accessory 1 failed to trip the circuit breaker when it should have based on information received from the circuit breaker over the communication bus 5, and based on readings of the current sensor 6 and voltage sensor 7 indicating that power was provided to the accessory 1 for the purpose of tripping the circuit breaker.

Still referring to FIG. 5, at step 41 of diagnostic 40, the external power source 50 applies power to the accessory 1. At step 42, the processor 4 receives information from the circuit breaker, the current sensor 6, the voltage sensor 7, and/or other information sources indicating that the accessory 1 should have tripped the circuit breaker, and the processor 4 checks whether the accessory 1 initiated the required trip. If the processor 4 determines that the accessory 1 did trip the circuit breaker, the diagnostic 40 ends at step 43. If the processor 4 determines that the accessory 1 failed to trip the circuit breaker, the diagnostic 40 proceeds to step 44 and checks whether the most recent measurement of $I_{coil}$ through the solenoid coil 14 falls within a normal operating range. It will be appreciated that the processor can refer to the information being gathered during the concurrently running coil diagnostic 30 previously described with respect to FIG. 3 to determine whether $I_{coil}$ falls within the normal operating range. If the processor 4 determines at step 44 that $I_{coil}$ falls outside of the normal operating range, then the processor 4 reports the abnormal coil condition by triggering an alarm at step 45 that corresponds to the particular coil condition as detected according to the coil diagnostic 30.

If the processor 4 determines at step 44 that $I_{coil}$ falls within the normal operating range, then the diagnostic 40 proceeds to step 46 and the processor 4 checks whether the current signature of the solenoid coil 14 is indicative of movement by the plunger 12 in order to determine the operating condition of the plunger 12, i.e. whether or not the plunger 12 is stuck and unable to move relative to the solenoid 11. For example and without limitation, the magnitude of $I_{coil}$ is greatest when a plunger stroke to pull the plunger 12 into the solenoid 14 is initiated. After a plunger stroke is initiated, $I_{coil}$ decreases significantly due to the interaction between the magnetic flux created by the movement of the plunger 12 and the magnetic flux of the coil 14. An increase in $I_{coil}$ to initiate a plunger stroke that is not followed by a decrease in $I_{coil}$ can be indicative of the plunger 12 being stuck and unable to move relative to the solenoid 11.

Accordingly, at step 46 of the plunger diagnostic 40, the processor 40 can check the current signature of the coil 14 from the time interval when the accessory 1 should have tripped the circuit breaker to determine whether an initial increase of $I_{coil}$ (to initiate a plunger stroke) was followed by a significant decrease (indicative of the plunger 12 moving into the solenoid 14). If the processor 4 determines at step 46 that the current signature of the coil 14 does not indicate movement of the plunger 12, then the processor 4 triggers an alarm at step 47 notifying the user to check whether the plunger 12 is stuck. If, however, the processor 4 determines at step 46 that the current signature of the coil 14 indicates that there was movement of the plunger 12 at the time interval of the necessary trip, then the processor 4 triggers an alarm at step 47 notifying the user to check the circuit breaker because a necessary trip did not occur and the accessory 1 is functioning properly. The plunger diagnostic then concludes at step 49.

Including self-diagnostic functionality in the accessory 1 with regard to the internal components of the accessory 1 enables the accessory 1 to immediately alert a user of the associated circuit breaker if any of the internal components of the accessory 1 are failing or no longer operational. This functionality presents several advantages. First, it alerts the user that there is an issue with the accessory 1, as opposed to the circuit breaker, or vice versa, in the event that a necessary trip fails to occur. Second, it alerts the user as to which particular internal actuating component of the accessory 1 is failing. Third, the continuous evaluation of the sufficiency of the accessory 1 internal components alerts the user of any operating issues in a timely manner, so that the failing or nonoperational component can be replaced before the accessory 1 fails to operate as needed or in enough time to minimize the damage from a failure of the accessory 1.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A smart accessory device structured to be operatively connected to a circuit breaker so as to actuate an operating mechanism of the circuit breaker, the smart accessory device comprising:
   a power section structured to be electrically connected to a power source, the power section comprising:
   an actuator structured to actuate the operating mechanism of the circuit breaker, the actuator comprising:
   a solenoid comprising a coil of conductive wire; and
   a ferromagnetic plunger coupled to the solenoid and structured to move relative to the solenoid in response to current flowing through the solenoid;
   a current sensor structured to sense a current flowing through the power section; and
   a voltage sensor structured to sense a voltage across the power section; and
   a control section electrically and operatively connected to the power section, the control section comprising a processor,
   wherein the power section and the control section are not components of the operating mechanism, and
   wherein the processor is configured to determine an operating condition of the actuator based on how much current flows through the coil when the power source provides power to the smart accessory device.

2. The smart accessory device of claim 1, wherein the smart accessory device is one of a shunt trip device, a spring release device, or an under voltage release device.

3. The smart accessory device of claim 1, wherein the processor is configured to determine whether the operating condition of the actuator enables the smart accessory device to actuate the operating mechanism of the circuit breaker.

4. The smart accessory device of claim 1, wherein the processor is configured to determine when the coil is in one of an open condition, a shorted condition, and a partially shorted condition based on how much current flows through the coil when the power source provides power to the smart accessory device.

5. The smart accessory device of claim 4, wherein the processor is configured to trigger an alarm when the processor determines that the coil is in one of the open condition, the shorted condition, and the partially shorted condition.

6. The smart accessory device of claim 5, wherein the alarm comprises one of a visual notification, a sound notification, or a notification sent to a remote device via wireless communication.

7. The smart accessory device of claim 1, wherein the processor is configured to determine when the ferromagnetic plunger is stuck in position relative to the solenoid based on how much current flows through the coil when the power source provides power to the smart accessory device.

8. The smart accessory device of claim 7, wherein the processor is configured to trigger an alarm when the processor determines that the ferromagnetic plunger is stuck in position relative to the solenoid.

9. The smart accessory device of claim 8, wherein the alarm comprises one of a visual notification, a sound notification, or a notification sent to a remote device via wireless communication.

10. The smart accessory device of claim 1,
wherein the processor is configured to determine whether a failure of the smart accessory device to actuate the operating mechanism of the circuit breaker has occurred,
wherein the processor is configured to determine whether the failure of the smart accessory device was due to one of the operating condition of the coil or the operating condition of the ferromagnetic plunger.

11. A smart accessory device structured to be operatively connected to a circuit breaker so as to actuate an operating mechanism of the circuit breaker, the smart accessory device comprising:
a power section structured to be electrically connected to a power source, the power section comprising:
an actuator structured to actuate the operating mechanism of the circuit breaker, the actuator comprising:
a solenoid comprising a coil of conductive wire; and
a ferromagnetic plunger coupled to the solenoid and structured to move relative to the solenoid in response to current flowing through the solenoid;
a current sensor structured to sense a current flowing through the power section; and
a voltage sensor structured to sense a voltage across the power section; and
a control section electrically and operatively connected to the power section, the control section comprising a processor,
wherein the power section and the control section are not components of the operating mechanism,
wherein the processor is configured to determine an operating condition of the actuator based on how much current flows through the coil when the power source provides power to the smart accessory device, and
wherein the processor is configured to continually execute a coil diagnostic to determine the operating condition of the coil as long as power is being provided to the smart accessory device.

12. The smart accessory device of claim 11, wherein the smart accessory device is one of a shunt trip device, a spring release device, or an under voltage release device.

13. The smart accessory device of claim 11, wherein the processor is configured to determine whether the operating condition of the actuator enables the smart accessory device to actuate the operating mechanism of the circuit breaker.

14. The smart accessory device of claim 11, wherein the processor is configured to determine when the coil is in one of an open condition, a shorted condition, or a partially shorted condition based on how much current flows through the coil when the power source provides power to the smart accessory device.

15. The smart accessory device of claim 14, wherein the processor is configured to trigger an alarm when the processor determines that the coil is in one of the open condition, the shorted condition, or the partially shorted condition.

16. The smart accessory device of claim 15, wherein the alarm comprises one of a visual notification, a sound notification, or a notification sent to a remote device via wireless communication.

17. The smart accessory device of claim 11, wherein the processor is configured to determine when the ferromagnetic plunger is stuck in position relative to the solenoid based on how much current flows through the coil when the power source provides power to the smart accessory device.

18. The smart accessory device of claim 17, wherein the processor is configured to trigger an alarm when the processor determines that the ferromagnetic plunger is stuck in position relative to the solenoid.

19. The smart accessory device of claim 18, wherein the alarm comprises one of a visual notification, a sound notification, or a notification sent to a remote device via wireless communication.

20. The smart accessory device of claim 11,
wherein the processor is configured to determine whether a failure of the smart accessory device to actuate the operating mechanism of the circuit breaker has occurred,
wherein the processor is configured to determine whether the failure of the smart accessory device was due to one of the operating condition of the coil or the operating condition of the ferromagnetic plunger.

* * * * *